United States Patent [19]
Griffith et al.

[11] 3,974,478
[45] Aug. 10, 1976

[54] KEY SWITCH SCANNING AND ENCODING SYSTEM

[75] Inventors: Glen R. Griffith, Westminster; Ralph Deutsch, Sherman Oaks, both of Calif.

[73] Assignee: Nippon Gakki Seizo Kabushiki Kaisha, Hamamatsu, Japan

[22] Filed: Oct. 29, 1974

[21] Appl. No.: 518,412

Related U.S. Application Data

[62] Division of Ser. No. 386,968, Aug. 9, 1973, Pat. No. 3,899,951.

[52] U.S. Cl. .......................... 340/166 R; 340/365 S; 340/147 P
[51] Int. Cl.[2] ...................... G06F 3/02; H04Q 9/00
[58] Field of Search ................. 84/1.01; 340/365 S, 340/147 P, 166 R

[56] References Cited
UNITED STATES PATENTS

| | | | |
|---|---|---|---|
| 3,662,378 | 5/1972 | MacArthur | 340/365 S X |
| 3,750,160 | 7/1973 | Elzinga | 340/365 S X |
| 3,792,466 | 2/1974 | Arnold et al. | 340/365 S X |

*Primary Examiner*—Donald J. Yusko
*Attorney, Agent, or Firm*—Howard A. Silber

[57] ABSTRACT

In this key switch scanning and encoding system, open (OFF) switches may be scanned at a faster rate than closed (ON) switches, and a coded signal is produced indicative of each closed switch. The switches are arranged in a matrix of M groups each connected to N common output lines. The switch groups are enabled sequentially, one at a time. As each group of switches is enabled, the N output lines sequentially are gated to a coding matrix. If the gated line is associated with a closed switch in the enabled group, an output code is produced by the code matrix, which, together with a signal designating the enabled group, uniquely identifies the closed switch. Scanning is delayed briefly to permit utilization of the encoded output. If an open (OFF) switch is scanned, no code is produced by the code matrix. This no-code condition immediately causes the next switch matrix output line to be gated to the code matrix. In this way, open switches are "skipped over" or scanned at a rapid rate. The system is particularly useful in an electronic musical instrument.

12 Claims, 3 Drawing Figures

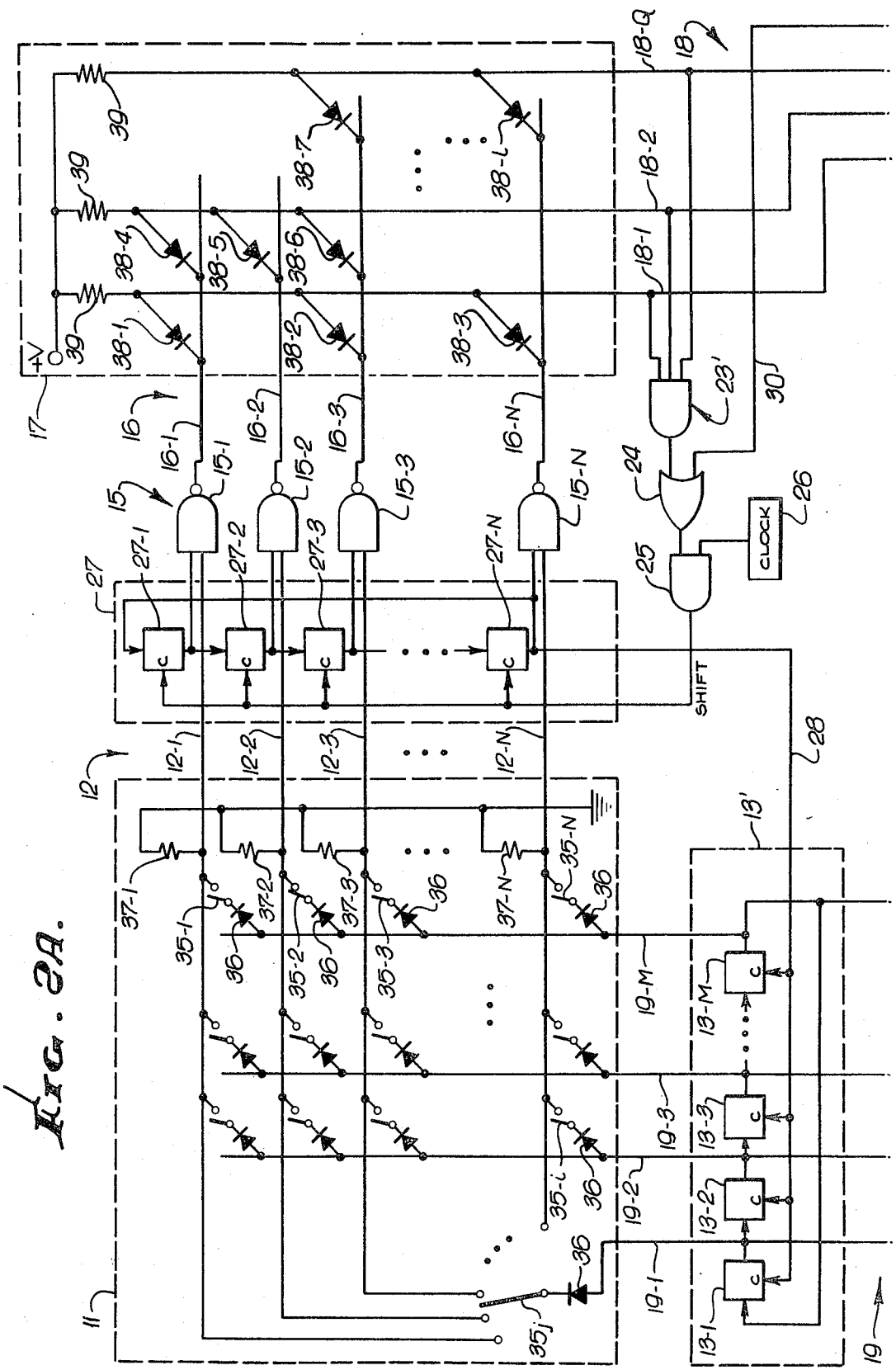

KEY SWITCH SCANNING AND ENCODING SYSTEM

CROSS REFERENCE TO RELATED APPLICATION

This is a division of application Ser. No. 386,968, filed Aug. 9, 1973 and now U.S. Pat. No. 3,899,951.

BACKGROUND OF THE INVENTION

1. Field of the Invention

The present invention relates to a key switch scanning and encoding system useful in an electronic musical instrument.

2. Description of the Prior Art

In an electronic keyboard musical instrument such as an electronic organ or piano, a significant problem relates to interconnection of the keyboard switches and the tone generation electronics. Typically an electronic organ has several manual keyboards, a pedal keyboard and a bank of stop selection switches. if separate wires connect each keyboard and stop switch to the electronics, the result is a maze of wiring which is costly to assemble and difficult to service. Simplication is desired.

One approach is to use time division multiplexing wherein a unique time slot is associated with each keyboard switch. The presence or absence of a pulse in that time slot indicates whether the corresponding key has been depressed. The advantage is that only a single multiplex line need interconnect the keyboards and the instrument electronics. However, there are two shortcomings. First, the time to scan all switches is fixed, since a unique time slot is made available to each switch whether open or closed. As a result, there may be an undesirable time lapse between the depression or release of a key and detection of this new condition. For example, if closure of a certain switch occurs just after that switch was scanned, an entire fixed length scanning cycle will pass before the condition is detected, even if no other switch is closed. Secondly, utilization of the multiplexed signal requires separate decoding circuitry in time lock with the encoder, thereby complicating the requisite circuitry.

A time division multiplex note selection system is shown by Watson in the U.S. Pat. No. 3,610,799. There, the keyboard switches are organized in an array with the twelve note switches in each octave of each manual or pedal keyboard arranged in a separate column associated with that octave and keyboard. All row outputs of the array are combined onto a single multiplex signal line.

The entire array is scanned at a fixed clock rate. Thus during the first twelve clock periods the twelve switches associated with the highest octave of one manual are scanned. Next the twelve switches associated with the second octave of the same manual are scanned, and so forth. With this sequential scanning arrangement, the multiplexed waveform present on the common output line will comprise pulses in time slots corresponding to the notes selected on the keyboard. The total time taken to scan the keyboard array, corresponding to the length of the multiplexed waveform, is Kt, where K is the number of switches in the array and t is the fixed clock period.

To utilize the multiplex signal requires decoder circuitry in time lock with the scanning clock. In the instrument described by Watson, musical tones are generated by repetitive readout of a musical waveshape stored in memory. The phase angle between successive memory sample points establishes the note fundamental frequency. Watson uses the decoded multiplex signal to control this phase angle, and hence to establish the note produced by the instrument. Decoder circuitry derives a phase-angle-controlling signal by comparing the time of occurrence of each pulse on the multiplex line with the contents of a clock-advanced keyboard counter also used to govern scanning of the switching array.

Another time division multiplexing technique is disclosed by Klann in the U.S. Pat. No. 3,614,287 in conjunction with intermanual coupling. By pulse controlled sequential connection of manual coupling and note selection switches, economy of wiring is achieved while enabling the keys on one keyboard to actuate a coupled voice on the same or a different manual.

The commutation of separate waveform generator outputs onto a common line for processing by a single waveform shaper and sound system is disclosed in the U.S. Pat. No. 2,989,885 to Pearson. There, delay line commutation, at a rate which is high in comparison to the generated tones, is used to mix the outputs of key-switch selected waveform generators onto a common line. This technique permits the use of common timbre-determining circuits but requires a separate line from each waveform generator to the associated keyboard switch.

An object of the present invention is to provide a system for keyboard encoding, useful in an electronic musical instrument, which does not require a fixed scan rate independent of how many switches are selected. Open or "OFF" switches are scanned at a higher rate than switches which are "ON". Economy in scanning rate is achieved, so that each newly closed or released switch is detected without significant delay. Encoding signals are derived, indicative of each selected key. The encoded signals are provided via a few lines for direct utilization by electronic tone generation or other circuitry. Economy of wiring is achieved without the limitation of fixed time scanning and without the requirement for time lock decoding at the point of utilization.

SUMMARY OF THE INVENTION

In accordance with the present invention there is provided a system for asynchronously scanning and encoding a plurality of key switches. The switches are arranged in a matrix of M groups each connected to N common output lines. A group select counter sequentially enables each of the groups, so that closed switches in the enabled group provide outputs along the associated ones of the N output lines. These N output lines are scanned at a rapid rate until a line associated with a closed switch is detected. An encoded signal identifying that line is produced by a code matrix. This encoded signal, together with an output from the group select counter, uniquely identifies the selected switch. After a delay time sufficient to permit utilization of the encoded key switch signal, line scanning continues. The group select counter is advanced each time all N output lines have been scanned, thereby enabling scanning of the next group of switches. In this manner the switch matrix is monitored completely and continuously.

Scanning of the matrix output lines is accomplished by line scan logic including an N-stage recirculating shift register and N line select gates. Each gate connects an associated output line to the code matrix when enabled by a respective one of the shift register stages. If the line gated to the code matrix is associated with an open (OFF) switch, the code matrix produces no coded output. Detection of this no-code condition causes the shift register to advance at a rapid rate. In this manner, minimum time is spent in scanning non-selected switches.

When a line associated with a closed (ON) switch is gated to the code matrix, an encoded output is produced. The shift register remains set for a brief dwell period sufficient to permit utilization of the switch-identifying code. Thereafter, an answerback or "OK" signal, provided from the utilization means or by a delay circuit, causes the shift register to advance the next state, thereby gating the next line to the code matrix and continuing the scanning operation.

The scanning rate is not fixed. A short time $t_s$ is taken to "skip over" non-selected keys, while a longer time $t_d$ is permitted for encoding and utilization of selected keys. Thus if only $k$ switches are closed (ON), the time $T_s$ to scan the selected switches is $T_s = kt_d$ and the time $T_c$ to skip over the non-selected switches is $T_c = (K-k)t_s$ where $K$ is the total number of switches in the array. The time saving $\Delta t$, as compared with the time to scan the entire array of keyboard switches at a fixed rate $t = t_d$ (required in a time division multiplex system) is given by $$\Delta t = Kt - (T_s + T_c)$$
$$= Kt - [kt_d + (K-k)t_s]$$
$$= (K-k)(t-t_s)$$

This time saving is significant, particularly in an instrument having many manual and pedal keyboards, stops and controls.

BRIEF DESCRIPTION OF THE DRAWINGS

A detailed description of the invention will be made with reference to the accompanying drawings, wherein like numerals designate corresponding parts in the several figures.

FIGS. 2A and 2B together comprise an electrical schematic diagram of an illustrative circuitry for implementing the system of FIG. 1.

DESCRIPTION OF THE PREFERRED EMBODIMENT

The following detailed description is of the best presently contemplated mode of carrying out the invention. This description is not to be taken in a limiting sense, but is made merely for the purpose of illustrating the general principles of the invention since the scope of the invention best is defined by the appended claims.

Figure 1:
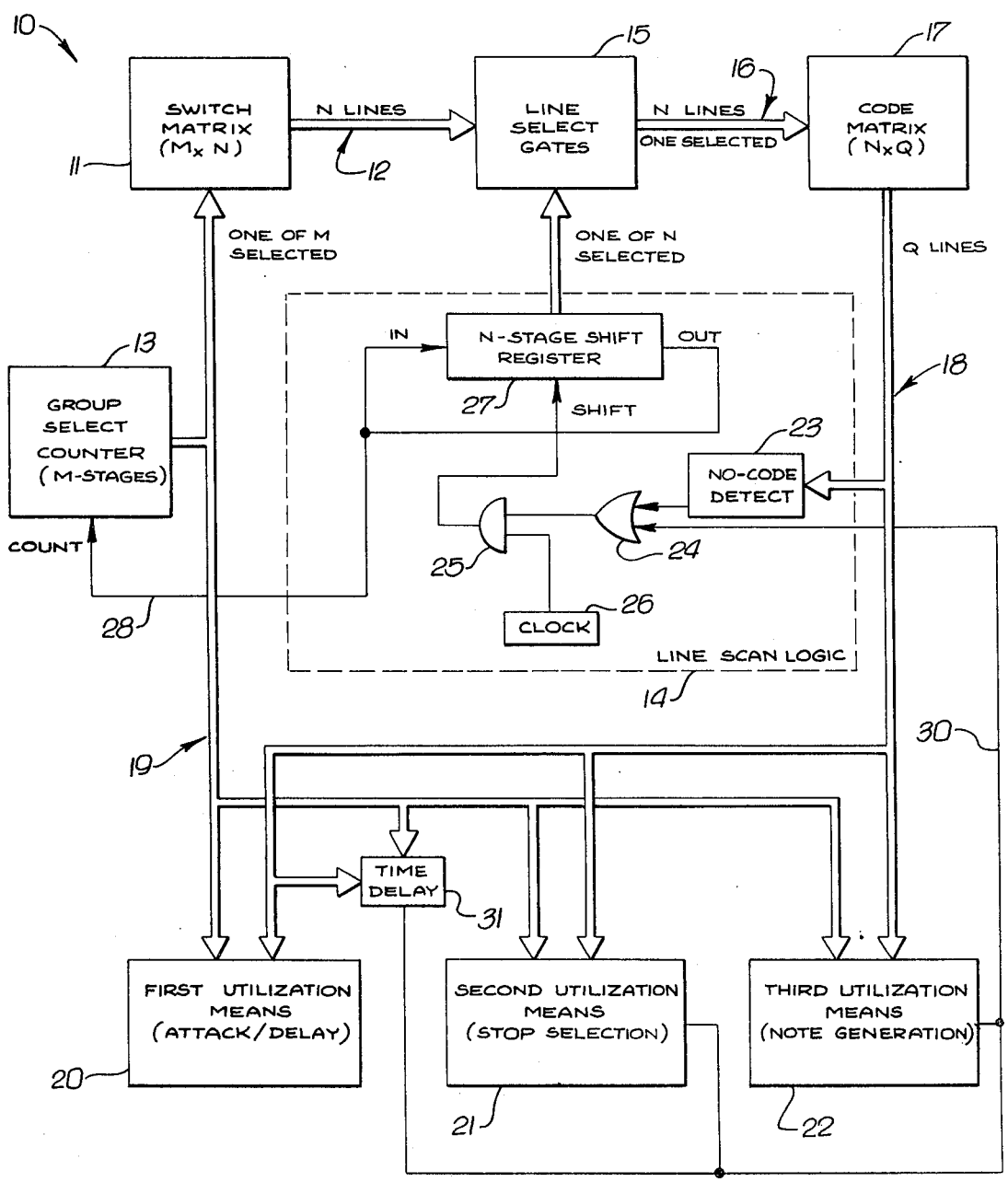
FIG. 1 is an electrical block diagram of a key switch scanning and encoding system in accordance with the present invention.

In the key coding system 10 of FIG. 1, the switches to be encoded are arranged in a matrix 11 of M groups each containing up to N switches. The switches are associated with N output lines 12 so that when one of the M groups is enabled by a group select counter 13, an output is provided only on those output lines 12 associated with closed (ON) switches in the enabled group.

The output lines 12 from the switch matrix 11 are scanned sequentially by line scan logic 14 cooperating with N line select gates 15. in sequence, each line 12 is connected via a buss 16 to a code matrix 17. If the line gated to the code matrix 17 is associated with a closed switch in the enabled group in the matrix 11, a code appears on a buss 18 designating the gated line 12. This code, in conjunction with an output from the group select counter 13 on a buss 19 indicative of the enabled group, together uniquely identify the closed switch in the matrix 11. The encoded key data is supplied to appropriate utilization means 20–22.

If the line gated to the code matrix 17 is associated with a switch which is open (OFF), the code matrix 17 will provide no output code on the buss 18. This no-code condition causes the line scan logic 14 and gates 15 immediately to connect the next one of the N lines 12 to the code matrix 17. To that end, a no-code detection circuit 23 senses the absence of a coded signal on the buss 18 and accordingly provides a signal via an OR gate 24 to enable an AND gate 25. A clock pulse supplied from a clock 26 via the enabled gate 25 causes a recirculating N-stage shift register 27 to advance (shift) one position. This enables the line select gates 15 to gate the next successive matrix output line 12 to the code matrix 17. Scanning of non-selected key switches progresses at a rapid rate.

The N-stage shift register 27 contains a single binary one bit. As each successive stage receives this binary one, a corresponding line select gate 15 is enabled. When the shift register 27 recirculates, a pulse is supplied via a line 28 to the "count" input of the group select counter 13. This increments the counter 13 so as to enable the next group of switches in the matrix 11. Scanning continues as the N lines 12, now associated with the switches in the newly selected group, are gated one-by-one to the code matrix 17. The group select counter 13 is of modulo M, so that all switch groups in the matrix 11 will be sequentially, repetitively enabled.

Each time a line 12 associated with a closed (ON) switch is gated to the code matrix 17, a coded output is produced on the buss 18. As a result, no output is produced by the no-code detector, causing the shift register 27 to dwell in its current state. Scanning is suspended to permit utilization of the encoded signal by the means 20–22. Scanning continues when an answerback or "OK" signal is provided via a line 30 to the OR gate 24. Receipt of this "OK" signal gates another clock pulse to the shift register 27 causing the next matrix output line 12 to be scanned. The answerback or "OK" signal may be provided by a delay circuit 31 a fixed time after occurrence of the coded output on the buss 18. Alternatively, the utilization means 21, 22 may provide answerback signals after the encoded key information has been utilized.

Figure 2B:
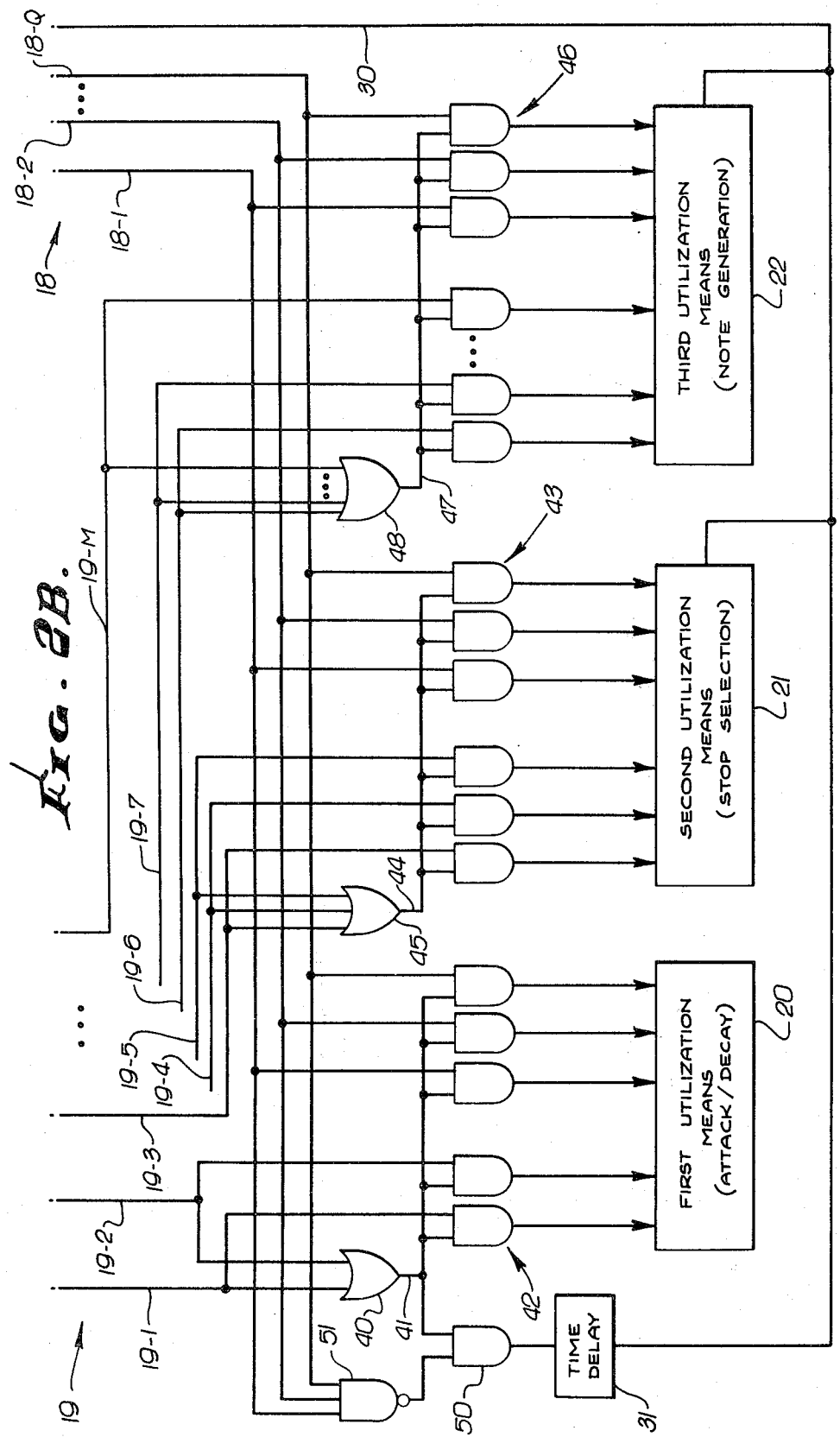

Exemplary circuitry for implementing the key coding system 10 is shown in FIGS. 2A and 2B. Referring thereto, the switch matrix 11 contains a plurality of switches 35-1, 35-2, . . . . 35-i and a multiple position switch 35-j connected in an M by N array. Each position of the switch 35-j is considered a separate switch in the matrix 11. An electrical isolation diode 36 is associated with each switch 35. Typically, certain switches 35, used for note selection, are actuated by keyboard or pedal keys. Other switches 35 may be used for stop selection, to control attack and decay, or for other functions in an electronic musical instrument.

In the embodiment of FIG. 2, an M-stage recirculating shift register 13' is used instead of the counter 13 to enable sequentially the M groups of switches 35 in the matrix 11. The output of each register stage 13-1, 13-2, . . . 13-M is connected to a respective one of the group enable lines 19-1, 19-2, . . . 19-M. Only one stage of the register 13' contains a binary one; the corresponding group of switches 35 will be enabled. All other register 13' stages contain binary zeros. Each time a pulse is received via the line 28 the register 13' is shifted, moving the single one bit to the next stage and thereby enabling the next group of switches in the matrix 11.

For example, if register stage 13-M contains the single one bit, the associated group enable line 19-M will be at a positive voltage, thereby enabling the group of switches 35-1 through 35-N connected to the line 19-M. All other group enable lines 19 except for the line 19-M will be at ground potential. Upon receipt of the next shift pulse on the line 28, the register 13' will recirculate, moving the one bit to the state 13-1 and enabling the group of switches associated with the line 19-1.

The matrix output lines 12 normally are biased to ground potential via the resistors 37-1 through 37-N. However, if any of the switches 35 in the enabled group are closed, the corresponding output lines 12 will go high, i.e., will go to the positive voltage level supplied from the enabling stage in the register 13'. Thus in FIG. 2, the switch 35-2 is closed; when the line 19-M is enabled, the output line 12-2 will be high, and all other matrix output lines 12 will be low. Of course, more than one switch (or no switch) in each enabled group may be closed.

The line select gates 15 include NAND gates 15-1 through 15-N each receiving as one input the respective matrix output line 12-1 through 12-N. The second input of each NAND gate 15 is connected to the respective stage 27-1 through 27-N of the N-stage recirculating shift register 27. This register 27 also contains a single binary one which is shifted by occurrence of a pulse from the AND gate 25. The register 27 stage containing the binary one enables the corresponding NAND gate 15; all other gates 15 are disabled.

With this arrangement, each of the matrix output lines 12 will be connected in sequence to the code matrix 17 as the single binary one bit is circulated through the shift register 27. For example, at the beginning of a line scanning cycle, the register stage 27-1 will enable the line select gate 15-1 to connect the line 12-1 to the code matrix input line 16-1. At successive shifts of the register 27, the gates 15-2 through 15-N successively will be enabled to connect the corresponding lines 12-2 through 12-N to the code matrix 17. When the "one" bit then recirculates back to the stage 27-1, the same pulse, supplied via the line 28, will cause the group select register 13' to shift, thereby enabling the next group of switches in the matrix 11.

The code matrix 17 comprises an array of diodes 38-1 through 38-Z interconnecting the input lines 16 and the output lines 18. The lines 18 are biased to a positive voltage +V via a set of resistors 39. The code matrix 17 provides on the lines 18-1 through 18-Q a coded output if the line 12 gated to the code matrix is associated with a closed, enabled switch in the matrix 11. If the gated line 12 is associated with an open switch in the matrix 11, all of the lines 18-1 through 18-Q will remain high, the condition indicating that no code is present.

In the example wherein the group line 19-M is enabled, when the line 12-1 is gated to the code matrix 17, the line 16-1 will remain high since the corresponding switch 35-1 is open. In this case, all of the lines 18 will remain high; no output code is produced. When the gate 15-2 is enabled, the line 16-2 will go to a low potential since the corresponding switch 35-2 is closed. Accordingly, the line 18-2 which is connected by the diode 38-5 to the line 16-2 will drop to low potential, and the lines 18-1 and 18-Q will remain high; this combination comprises the code designating the selected line 16-2. Together with the group identifying signal present on the line 19-M, the code on the lines 18 uniquely identifies the switch 35-2 as being closed.

In the embodiment of FIG. 2A, the no-code detector 23 comprises an AND gate 23' to which the lines 18 are connected. If all of the lines 18-1 through 18-Q are high, indicative of the no-code condition, the output from the AND gate 23' also will be high. This output, supplied via the OR gate 24, enables the AND gate 25 to provide a clock pulse to the shift register 27. This advances this shift register 27 and gates the next line 12 to the code matrix 17. If no code again is produced on the lines 18, another clock pulse is gated to the register 27. In this manner, line scanning continues at the clock 26 rate until a closed switch 35 is detected. When this occurs, a code will appear on the lines 18 and at least one of the lines 18-1 through 18-Q will be low. As a result, the output of the AND gate 23 will be low. Scanning will stop until an answerback or "OK" signal is received via the line 30 from the utilization means 21, 22 or from the time delay 31.

In the embodiment shown, the groups of switches enabled by the lines 19-1 and 19-2 of the matrix 11 are associated with the first utilization means 20, the switches enabled by the lines 19-3 through 19-5 are utilized by the second means 21 and the switches enabled by the lines 19-6 through 19-M are used to control the third utilization means 22. The logic of FIG. 2B shows an illustrative gating arrangement for supplying the encoded signals from the system 10 to the respective utilization means 20, 21 and 22.

The group enable lines 19-1 and 19-2 are connected to an OR gate 40 to produce a gating signal on a line 41 when either of the first two groups of switches in the matrix 11 is being scanned. This gating signal enables a set of AND gates 42 which connect the code-carrying lines 18-1 through 18-Q and the group designating lines 19-1 and 19-2 to the first utilization means 20. Similarly, when any of the group enable lines 19-3 through 19-5 is selected, a set of output AND gates 43 is enabled by a signal provided on a line 44 by an OR gate 45 connected to the lines 19-3 through 19-5. The AND gates 43 supply to the second utilization means 21 the coded signals on the line 18 and the group designating signals on the lines 19-3 through 19-5. A set of AND gates 46, enabled by a signal on a line 47 supplied by an OR gate 48, provide the encoded output to the third utilization means 22 when any of the group enable lines 19-6 through 19-M is selected.

When an encoded output is supplied to the first utilization means 20, the answerback or "OK" signal is provided by the time delay circuit 31. To this end, when either of the group enable lines 19-1 or 19-2 is selected, the resultant signal on the line 41 also enables an AND gate 50. Occurrence of a coded signal on the lines 18 results in an output from a NAND gate 51 connected to receive that signal; this output is provided to the delay circuit 31 via the enabled gate 50. At the end of the delay time, the circuit 31 provides an "OK" signal via the line 30.

The inventive key coding system 10 may be employed with any type of utilization means, but is particularly useful with an electronic keyboard musical instrument of the type described in the U.S. Pat. application No. 225,883 to Deutsch entitled COMPUTOR ORGAN. In that instrument, the fundamental frequency of each generated musical note is established by a frequency number selected from a set of such numbers stored in a memory. The timbre or tonal quality of the note is established by a set of stored harmonic coefficients which determine the relative amplitudes of the Fourier components constituting the generated musical waveshape. Several sets of such harmonic components may be stored separately and chosen for utilization by stop selection switches. Attack and decay is implemented digitally by programmatically scaling the amplitudes of the constituent Fourier components during successive note generation cycles.

When the key coding system 10 is used with such a computor organ, the first utilization means 20 may comprise the attack/decay control components of the organ, the second utilization means 21 may comprise the stop selection circuitry and the third utilization means 22 may comprise the note generation circuitry. With this arrangement, the groups of switches enabled by the lines 19-6 through 19-M constitute the manual and pedal keyboard switches used for note selection. The encoded signals provided via the gates 46 to the note generation circuitry 20 are used to access from memory the corresponding frequency numbers. To this end, the coded signals provided via the gates 46 may correspond directly to frequency number memory addresses for the selected notes. Similarly, attack/decay control switches and stop selection switches are included in the matrix 11, enabled respectively by the lines 19-1, 19-2 and 19-3 through 19-5. Using the inventive system, newly actuated or released switches rapidly are detected, and wiring between the keyboards and other musical instrument circuitry is simplified.

Intending to claim all novel, useful and unobvious features shown or described inventors make the following claims:

1. In a system for scanning and encoding a plurality of switches arranged in a matrix of M groups each of which can be enabled separately, the switches in each group being connected to N commom output lines, the improvement wherein said system provides an encoded output for each actuated switch repetitively so long as that switch remains actuated, comprising:
   encoding circuitry,
   scanning means for sequentially gating each of said N output lines to said encoding circuitry, said encoding circuitry providing a coded signal identifying the gated line if the switch in the enabled matrix group associated with that gated line is actuated and providing no coded signal if the associated switch is open, said coded signal being provided repetitively each time said same switch is scanned so long as that switch remains actuated,
   skip means, responsive to the output of said encoding circuitry, for causing said scanning means rapidly to gate the next output line to said encoding circuitry if no coded signal is provided, and if a coded signal is provided from said encoding circuitry, for causing said scanning means to dwell for a period of time sufficient to permit utilization of said coded signal, and
   utilization means connected to the output of said encoding circuitry to receive said coded signal and to utilize both the identity of the actuated switch indicated by said coded signal and the duration of actuation of said switch as indicated by the continued repetition of said coded signal.

2. A switch scanning and encoding system according to claim 1 further comprising:
   group enabling means for sequentially enabling each of said M groups of switches in said matrix, said enabling means being advanced to enable the next group of switches upon completion of scanning of all N output lines by said scanning means.

3. A switch scanning and encoding system according to claim 2 wherein said utilization means receives both said coded signal provided by said encoding circuitry and a signal indicative of said enabled group of switches, said coded and group-indicative signals together uniquely identifying actuated switches in said matrix.

4. A switch scanning and encoding system according to claim 1 wherein said scanning means comprises:
   N gates each operative, when enabled, to connect a respective one of said N output lines to said encoding circuitry, and
   an N-stage recirculating shift register containing a gate-enabling signal in one stage and non-enabling signals in all other stages, each register stage being connected to a corresponding one of said gates so as to enable that gate when the corresponding stage contains said gate-enabling signal, the position of said gate-enabling signal being shifted in response to said skip means.

5. A switch scanning and encoding system according to claim 4 further comprising;
   an M-stage recirculating shift register containing a group-enabling signal in one stage and containing non-enabling signals in all other stages, each register stage being connected to a corresponding group of switches in said matrix so as to enable that group when the corresponding stage contains said gate-enabling signal, and means for shifting said M-stage register each time said N-stage register in said scanning means recirculates.

6. A switch scanning and encoding system according to claim 1 wherein said skip means comprises:
   a no-code detector responsive to the output of said encoding circuitry and supplying a no-code signal only if no code is provided by said encoding circuitry,
   answerback means for generating an answerback signal a period of time after a code signal is provided by said encoding circuitry, said scanning means gating the next line to said encoding circuitry in response to either said no-code signal or said answerback signal.

7. A switch scanning and encoding system according to claim 6 wherein said encoding circuitry comprises a diode code matrix, and wherein said no-code detector comprises a gate receiving as inputs the parallel code-containing lines from said code matrix.

8. A switch scanning and encoding system according to claim 7 wherein said answerback means comprises a time delay circuit actuated upon occurrence of a coded signal from said coding matrix and providing said answerback signal in time delayed response to said occurrence.

9. A switch scanning and encoding system according to claim 1 wherein said utilization means provides an answerback signal in response to such utilization of said encoded signal, said answerback signal causing said scanning means to resume scanning of said output lines.

10. A switch scanning and encoding system for providing an encoded output corresponding to each actuated switch repetitively for so long as that switch remains actuated, comprising:
- a matrix of switches arranged in M groups, the switches in each group being connected to N common output lines,
- group enabling means for enabling each of said M groups one at a time, so that output signals are provided only on those output lines associated with actuated switches in the enabled group,
- a code matrix having N inputs,
- N line select gates each gating one of said output lines to a respective input of said code matrix, said code matrix providing a coded output only if the switch in the enabled group and associated with the line gated to said code matrix is actuated,
- N-stage recirculating register means for sequentially enabling said line select gates,
- said group enabling means comprising an M-stage recirculating register in which only one stage at a time contains a line-enabling signal, said register being connected to said matrix so that as each of said M stages receives said line-enabling signal a corresponding one of said M groups of switches is enabled, said line-enabling signal being shifted from one stage to the next each time all of said line select gates have been enabled by said register means,
- shift means responsive to the output of said code matrix for causing said register means rapidly to enable the next line select gate upon detection of a no-code output condition from said code matrix and, if a coded output is provided from said code matrix, for causing said register means to enable the next line select gate after receipt of an answerback signal provided in delayed response to occurrence of a coded output from said code matrix, and
- a set of output terminals connected to said code matrix output and to said M-stage recirculating register to provide to an external utilization device a code indicative of each actuated switch, said code being provided repetitively at said output terminals so long as the associated switch remains actuated so as to inform said utilization device of both the identity and duration of actuation of each switch.

11. A switch scanning and encoding system according to claim 10 wherein said shift means comprises;
- a logic gate connected to said code matrix so as to provide a signal only if no coded output is provided from said code matrix,
- answerback means providing an answerback signal in delayed response to occurrence of a coded output from said code matrix, and
- means for providing a shift pulse to said N-stage register means in response either to said logic gate signal or to said answerback signal.

12. A switch scanning and encoding system according to claim 10 together with an external utilization device that receives said repetitive actuated-switch-indicative code from said output terminals and that provides such answerback signal in delayed response to each receipt of said code.

* * * * *